United States Patent
Dagher et al.

(10) Patent No.: US 9,325,341 B2
(45) Date of Patent: Apr. 26, 2016

(54) EXCESS LOOP DELAY COMPENSATION (ELC) FOR AN ANALOG TO DIGITAL CONVERTER (ADC)

(71) Applicant: QUALCOMM Incorporated, San Diego, CA (US)

(72) Inventors: Elias Hani Dagher, Aliso Viejo, CA (US); Kentaro Yamamoto, San Diego, CA (US); Dinesh Jagannath Alladi, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 14/475,852

(22) Filed: Sep. 3, 2014

(65) Prior Publication Data
US 2016/0065232 A1    Mar. 3, 2016

(51) Int. Cl.
*H03M 3/00* (2006.01)
*H03M 1/34* (2006.01)

(52) U.S. Cl.
CPC *H03M 1/34* (2013.01); *H03M 3/30* (2013.01); *H03M 3/37* (2013.01); *H03M 3/454* (2013.01); *H03M 3/458* (2013.01); *H03M 3/464* (2013.01)

(58) Field of Classification Search
CPC ......... H03M 3/30; H03M 3/37; H03M 3/454; H03M 4/458; H03M 4/464
USPC .................................................. 341/118, 143
See application file for complete search history.

(56) References Cited

U.S. PATENT DOCUMENTS

| | | | | |
|---|---|---|---|---|
| 6,414,615 B1 * | 7/2002 | Cheng | ...................... | H03M 3/37 341/143 |
| 7,535,392 B2 * | 5/2009 | Weng | ...................... | H03M 3/37 341/118 |
| 7,982,647 B2 | 7/2011 | Souda | | |
| 8,344,921 B2 * | 1/2013 | Lin | ...................... | H03M 3/30 341/143 |
| 8,514,117 B2 | 8/2013 | Srinivasan et al. | | |
| 8,791,848 B2 * | 7/2014 | Ho | ...................... | H03M 3/37 341/118 |
| 9,035,813 B2 * | 5/2015 | Miglani | ...................... | H03M 3/37 341/143 |
| 9,118,342 B2 * | 8/2015 | Singh | ...................... | H03M 3/37 |

(Continued)

OTHER PUBLICATIONS

Ranjbar M., "Power Efficient Continuous-Time Delta-Sigma Modulator Architectures for Wideband Analog to Digital Conversion," University of Massachusetts—Amherst, May 2012, pp. 1-206.

(Continued)

*Primary Examiner* — Khai M Nguyen
(74) *Attorney, Agent, or Firm* — Fountainhead Law Group P.C.

(57) ABSTRACT

In one embodiment, a circuit includes a quantizer configured to convert an analog input signal to a digital signal. The quantizer includes a first feedback path including a first digital to analog converter (DAC) coupled from an output of the quantizer to a summing junction that is coupled to an input of the quantizer. The first feedback path converts the digital signal to a first corresponding analog value for combining with the analog input signal at the summing junction. Also, the quantizer includes a plurality of excess loop delay (ELD) compensation paths coupled to the summing junction configured to compensate for excess loop delay from a second feedback path coupled from the output of the quantizer to input of the quantizer via a loop filter. Second DACs in the second feedback path convert the digital signal to a second corresponding analog value for combining with the analog input signal.

25 Claims, 5 Drawing Sheets

(56) References Cited

U.S. PATENT DOCUMENTS

2005/0068213 A1* 3/2005 Fontaine ............... H03M 3/37
341/143
2014/0077984 A1 3/2014 Shu

OTHER PUBLICATIONS

Zhang Y., et al., "Efficient technique for excess loop delay compensation in continuous-time ΔΣ modulators," Electronics Letters, Nov. 21, 2013, vol. 49 (24), pp. 1522-1523.

Ranjbar M., et al., "A Low-Power 1.92MHz CT Modulator With 5-bit Successive Approximation Quantizer", IEEE 2009 CICC, 2009, pp. 5-8.

International Search Report and Written Opinion—PCT/US2015/047709—ISA/EPO—Dec. 1, 2015.

Ranjbar M., et al., "A 3.1 mW Continuous-Time [Delta][Sigma] Modulator With 5-Bit Successive Approximation Quantizer for WCDMA," IEEE Journal of Solid-State Circuits, IEEE Service Center, Piscataway, NJ, USA, vol. 45, No. 8, Aug. 2010, pp. 1479-1491, XP011314250, ISSN: 0018-9200, DOI: 10.1109/JSSC.2010.2047423.

Tsai H-C., et al., "A 64-fJ/Conv.-Step Continuous-Time$\Sigma\Delta$ Modulator in 40-nm CMOS Using Asynchronous SAR Quantizer and Digital $\Delta\Sigma$ Truncator", IEEE Journal of Solid-State Circuits, IEEE Service Center, Piscataway, NJ, USA, Vol. 48, No. 11, Nov. 2013, pp. 2637-2648, XP011531071, ISSN: 0018-9200, DOI: 10.1109/JSSC.2013.2274852 [retrieved on Oct. 21, 2013].

* cited by examiner

EXCESS LOOP DELAY COMPENSATION (ELC) FOR AN ANALOG TO DIGITAL CONVERTER (ADC)

BACKGROUND

Unless otherwise indicated herein, the approaches described in this section are not admitted to be prior art by inclusion in this section.

Different types of analog-to-digital converters (ADCs) can convert an analog signal into a digital signal. For example, a continuous time delta sigma (CTDSM) ADC uses a delta-sigma modulator to convert an analog signal to a digital signal. The CTDSM ADC may use a loop filter to move low frequency noise up to higher frequencies outside the band of interest. The out-of-band noise may then be filtered. This may improve the analog-to-digital conversion.

A quantizer in the delta-sigma modulator may receive the output of the loop filter, and perform the analog-to-digital conversion to output a digital signal. A feedback loop of the CTDSM ADC includes digital-to-analog converters (DACs) that then convert the digital output of the quantizer to corresponding analog values. The analog values are then subtracted from the input signal of the loop filter or internal nodes within the loop filter, and the resulting signal is input back into the loop filter and then the quantizer.

Continuous time delta-sigma ADCs may suffer from excess loop delay (ELD). Excess loop delay may be caused by a finite propagation delay between the time the quantizer samples the analog signal and the time that the feedback DACs present the quantized samples back into the loop filter. The excess loop delay may degrade the stability of the CTDSM ADC and needs to be compensated for. For example, the CTDSM ADC may add an independent signal path, such as an additional excess loop delay compensation feedback path to compensate for the excess loop delay. The additional ELD compensation feedback path requires additional components including additional DACs, summers, and differentiators, which are costly in terms of area, power, and loop complexity. Additionally, as the CTDSM ADC varies in configuration, the additional signal path may not be able to compensate for the delay experienced by some of the configurations.

SUMMARY

The present disclosure generally relates to excess loop delay compensation for ADCs.

In one embodiment, a circuit includes a quantizer configured to convert an analog input signal to a digital signal. The quantizer includes a first feedback path including a first digital to analog converter (DAC) coupled from an output of the quantizer to a summing junction that is coupled to an input of the quantizer. The first feedback path converts the digital signal to a first corresponding analog value for combining with the analog input signal at the summing junction. Also, the quantizer includes a plurality of excess loop delay (ELD) compensation paths coupled to the summing junction configured to compensate for excess loop delay from a second feedback path coupled from the output of the quantizer to input of the quantizer. A set of second DACs in the second feedback path convert the digital signal to a second corresponding analog value for combining with the analog input signal.

In another embodiment, a system includes: a loop filter configured to receive an analog input signal; a quantizer configured to convert the analog input signal to a digital signal, the quantizer comprising a first feedback path including a first digital to analog converter (DAC) coupled from an output of the quantizer to a summing junction that is coupled to an input of the quantizer, wherein the first feedback path converts the digital signal to a first corresponding analog value for combining with the analog input signal; and a second feedback path coupled from the output of the quantizer to input of the quantizer, wherein a set of second DACs in the second feedback path convert the digital signal to a second corresponding analog value for combining with the analog input signal in the loop filter, wherein the quantizer comprises a plurality of excess loop delay (ELD) compensation paths coupled to the summing junction configured to compensate for excess loop delay from the second feedback path.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Particular embodiments provide multiple excess loop delay (ELD) compensation feedback paths. In one embodiment, the multiple ELD compensation feedback paths are included in a quantizer of an analog-to-digital converter (ADC), such as a continuous time delta sigma (CTDSM) ADC. Also, the quantizer may have a successive approximation register (SAR) block that includes SAR digital-to-analog converters (DACs) configured to feedback a digital output back into the SAR block. That is, the ELD compensation feedback paths may be coupled from the output of the SAR block to a summing junction used by the SAR DACs in the quantizer. Also, in one embodiment, the ELD compensation feedback paths may be embedded within a capacitor array for the SAR DACs. Further, the ELD compensation feedback paths may be programmable based on different configurations of the ADC and may also have different delays that may compensate for different ELDs.

Figure 1:
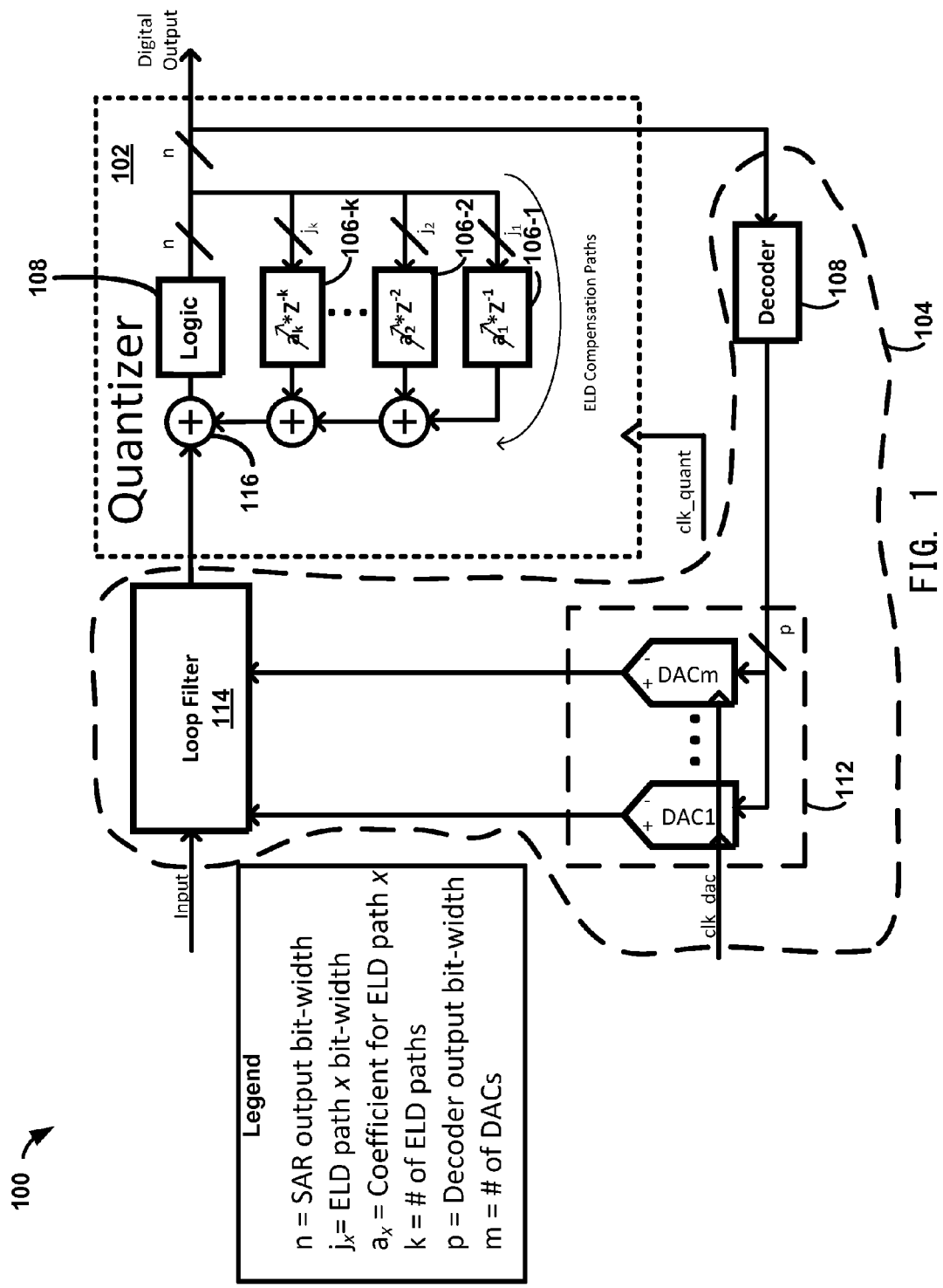
FIG. 1 shows an example of an ADC according to one embodiment.

FIG. 1 shows an example of an ADC 100 according to one embodiment. ADC 100 includes a quantizer 102 and an ADC feedback loop 104. Quantizer 102 may include logic 108 that may perform an analog-to-digital conversion, such as a successive approximation register (SAR) block. However, although a SAR block is discussed, other logic may also be used to perform the quantization. Also, within quantizer 102, multiple ELD compensation paths 106-1-106-$k$ are provided as feedback paths to compensate for different excess loop delays.

ADC feedback loop 104 includes a decoder 110, a set of feedback digital analog converters (DACs) 112, and a loop filter 114. ADC feedback loop 104 may receive the digital output of quantizer 102, which converted an analog input to the digital output. The output bit width of the digital output for quantizer 102 is denoted by n bits. ADC feedback loop 104 converts the digital output into a corresponding analog value via a number of DACs 112 is denoted as "m". The analog value from DACs 112 is then input into loop filter 114. In a delta sigma modulation, the analog value may be subtracted from the analog input via loop filter 114. Then, as discussed above, loop filter 114 moves low frequency noise up to higher frequencies outside the band of interest. A delta sigma ADC implemented by ADC 100 may be understood by a person skilled in the art and the description is omitted. Also, in one embodiment, ADC 100 may be a continuous time delta sigma (CTDSM) ADC, but may also be other ADCs, such as a discrete time delta sigma ADC. In a CTDSM ACD, loop filter 114 may be implemented using continuous time circuits.

Logic 108 may sample the input signal output by loop filter 114 to perform the conversion of the analog signal to the digital signal. A finite delay from the quantizer 102 sampling to the time when quantized samples are presented back into loop filter 114 by feedback DACs 112 may result, and may be referred to as excess loop delay (ELD). As discussed above, the excess loop delay may degrade the stability of ADC 100. To compensation for the ELD, multiple ELD compensation paths 106 are provided in quantizer 102. Although quantizer 102 includes ELD compensation paths 106, the ELD paths may be provided in other portions of ADC 100. For example, ELD compensation paths 106 may be provided from the output of quantizer 102 into loop filter 114. However, including ELD compensation paths 106 in quantizer 102 takes advantage of a summing junction 116 (e.g., addition, subtraction, etc.) that is included in quantizer 102. For example, summing junction 116 may already be included in quantizer 102 and be used by a feedback SAR DAC (not shown) that is used to feedback the digital output into logic 108 within quantizer 102 to account for the excess loop delay. The feedback SAR DAC will be discussed in more detail below.

Compensation paths 106-1, 106-2, . . . 106-$k$ are shown where the number "k" may be the number of ELD compensation paths. Each compensation path may be a bit width $j_x$. An ELD compensation path 106 may have a reduced resolution, $j_x$<n, to trade off ELD complexity with ADC noise, where n is the number of bits output by logic 108 for the digital output. That is, the resolution or bit width may be less than the bit width of the digital output of quantizer 102. The amount of compensation for each path is represented by a coefficient $a_x$ for the ELD path $k,a_x$, and may be an order of a z transform. A different coefficient may compensate for a different excess loop delay.

ELD compensation paths 106 may be programmed to provide compensation for different excess loop delays. For example, ADC 100 may have changes in its configuration occur, such as changes in the sampling rate, loop filter amplifier tuning, quantizer reconfiguration, or any other system level change that results in different excess loop delay in feedback loop 104. When the different configurations result in different excess loop delays, particular embodiments may program ELD compensation paths 106 to compensate for the different delays. For example, the coefficients $a_x$ of ELD compensation paths 106 may be programmed differently depending on the configuration of ADC 100. Additionally, using multiple ELD compensation paths 106 may allow particular embodiments to compensate for excess loop delays that are larger than the sampling period of ADC 100.

Figure 2:
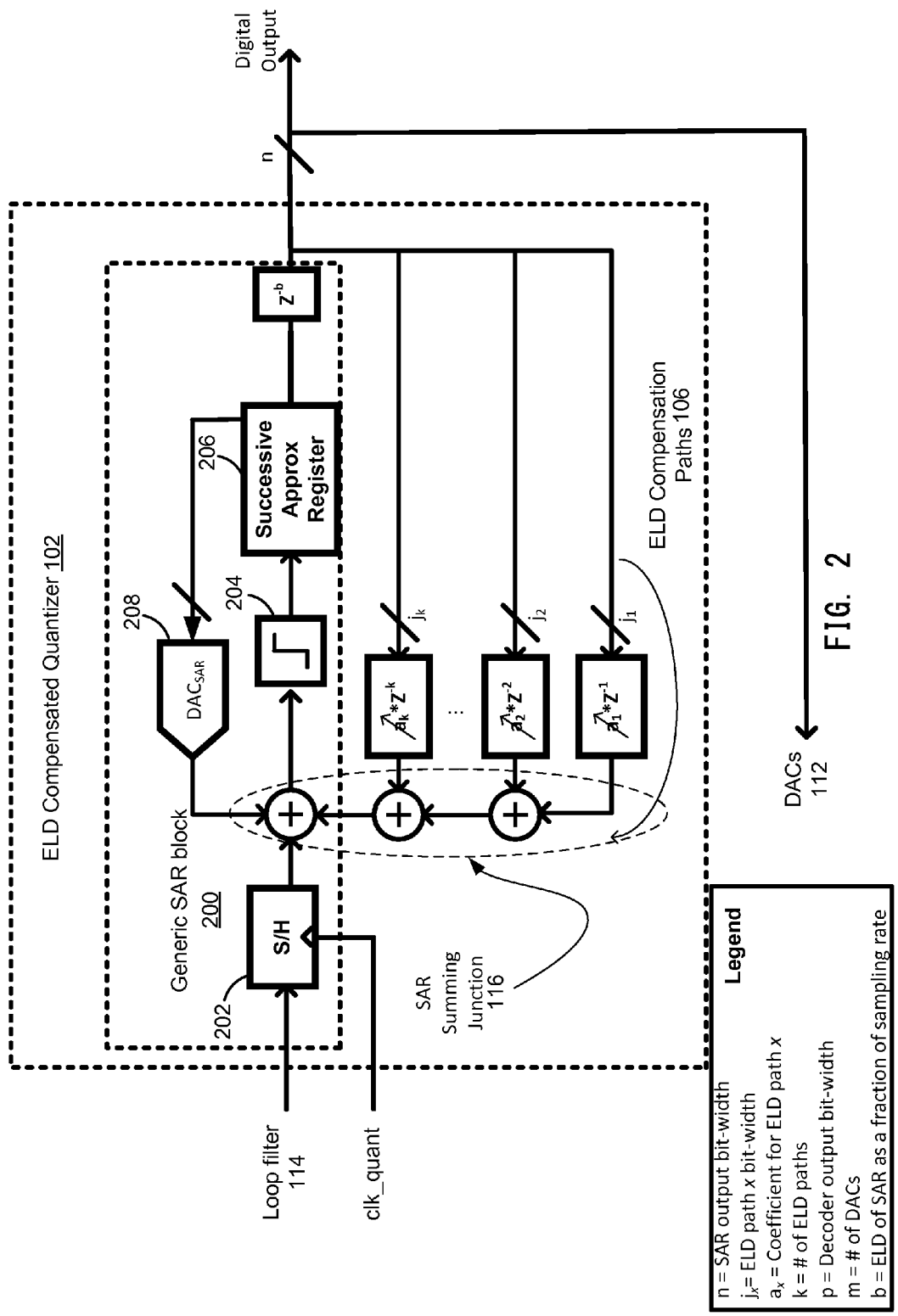
FIG. 2 depicts a more detailed example of a quantizer according to one embodiment.

ELD compensation paths 106 may be embedded in different types of quantizers 102. FIG. 2 depicts a more detailed example of quantizer 102 according to one embodiment. Quantizer 102 includes a generic SAR block 200 (referred to as logic 108 in FIG. 1). Generic SAR block 200 may be implemented using a capacitor array, charge sharing, current steering, or other implementation. Also, generic SAR block 200 may include a sample and hold (S/H) circuit 202, a summing junction 116, a comparator 204, a successive approximation register (SAR) 206, a feedback DAC 208 for the SAR (DAC$_{SAR}$), and a transform z block $z^{-b}$, where b is the ELD of the SAR as a fraction of the sampling rate. Although these components are described in generic SAR block 200, different components may also be included as well.

In the general operation of generic SAR block 200, the analog input signal is combined with the output of DACs 112 (e.g., subtracted from), and filtered in loop filter 114. Loop filter 114 shapes noise to the higher frequencies as discussed above. Generic SAR block 200 receives the output of loop filter 114 at a sample and hold circuit 202 that samples and stores the analog input value for a clock cycle. Summing junction 116 then combines the analog input value, the output of SAR DAC 208, and the output of ELD compensation paths 106. The resulting signal outputted from summing junction 116 has compensated for the excess loop delay.

A comparator 204 compares the signal from summing junction 116 with a reference value and outputs a comparison result. Then, successive approximation register 206 stores the comparison result. In one embodiment, a SAR ADC implements a successive approximation algorithm to convert an analog input signal to a digital output. As is known, successive comparisons are made to determine the digital output. Successive approximation register 206 may store an n-bit digital value for the conversion.

SAR DAC 208 is included in a SAR feedback path from the output of successive approximation register 206 into summing junction 116. The purpose of the SAR feedback path is to provide the digital output from successive approximation register 206 back to summing junction 116 for combination with the analog input. This implements the SAR algorithm. Particular embodiments may use summing junction 116 that already exists in generic SAR block 200 for the SAR feedback path to provide a point to include the multiple ELD compensation paths 106 in quantizer 200. By being included in quantizer 102, multiple ELD compensation paths 106 form a feedback path from the output of quantizer 102 to summing junction 116, which is inside of generic SAR block 200 within quantizer 102. The added ELD DAC paths provide the compensation for the ELD.

As shown, multiple ELD compensation paths 106 are input into summing junction 116, which is located in generic SAR block 200 before the input to comparator 204. This may leverage components already existing in generic SAR block 200 without having to add additional components, such as DACs, summers, and differentiators in loop filter 114.

Figure 3:
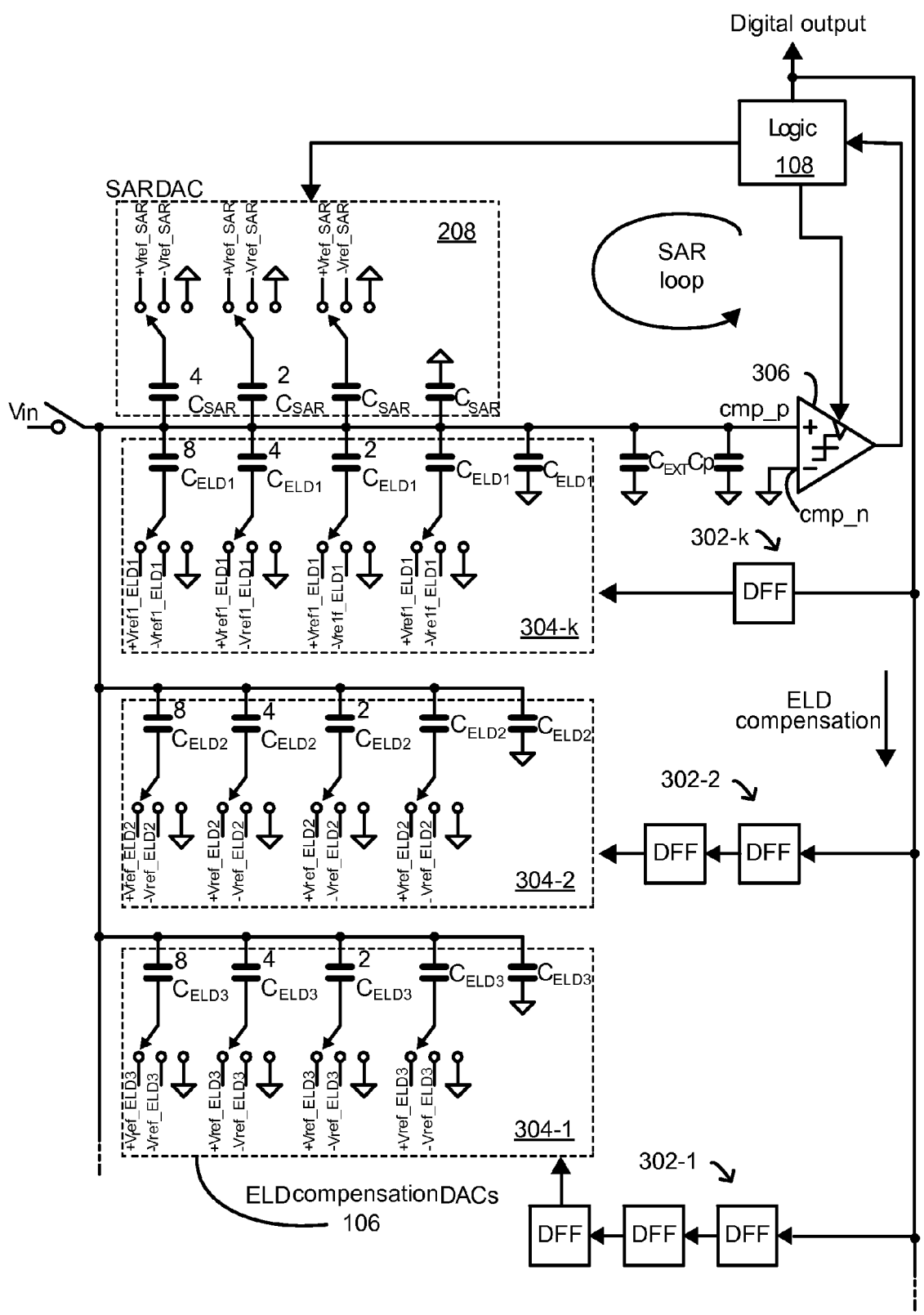
FIG. 3 depicts an example of integrating ELD compensation paths into a capacitive array for a SAR DAC according to one embodiment.

As mentioned above, ELD compensation paths 106 may be embedded in a capacitor array of SAR DAC 208; however, other implementations of ELD compensation paths 106 may be appreciated. By embedding multiple ELD compensation paths 106 in the capacitor array, op amps are not required for summing junction 116. FIG. 3 depicts an example of integrating ELD compensation paths 106 into a capacitive array for SAR DAC 208 according to one embodiment. Each compensation path 106 may include one or more delay elements 302. For example, D flip-flops (DFF) may provide different delays in ELD compensation paths 106. In one example, ELD compensation path 106-1 includes three D flip-flops 302-1, ELD compensation path 106-2 includes two D flip-flops 302-2, ELD compensation path 106-k includes D flip-flops 302-k, and so on. The different number of D flip-flops may introduce a different delay for each compensation path 106, and the number of flip-flops in each ELD compensation path 106 may be configurable.

Each ELD compensation path 106 may also include ELD compensation DACs 304-1-304-k. Each ELD compensation DAC 304 is merged with a capacitor DAC array for SAR DAC 208. For example, each ELD compensation DAC 304 may include ELD capacitors $C_{ELDx}$ and SAR DAC 208 includes SAR capacitors $C_{SAR}$. The summation occurs by reconfiguring each ELD compensation DAC 304 immediately after sampling the analog input signal to quantizer 102, Vin. Based on the comparison of comparator 306, the reference voltages Vref_ELDx may be switched differently for a sampling period. For example, a negative reference voltage, positive reference voltage, or ground may be coupled to capacitors $C_{ELDx}$. This affects the values stored in capacitors for ELD compensation DACs 304. Also, the reference voltage for SAR DAC 208 are switched based on the comparison. The charges stored in ELD capacitors and SAR capacitors are combined with the initial charge from Vin to compensate for ELD. A person of skill in the art will appreciate how to set the reference voltages in ELD compensation DACs 304 and SAR DAC 208.

As discussed above, the SAR ADC implements a successive approximation algorithm to convert an analog value to a digital value. The SAR ADC operates in two phases. Phase 1 may be a sampling phase in which input values are sampled on capacitors of the DACs 208 and 304 (along with DACs 110 (not shown)). During phase 2, the sampled input appears at the comparator inputs cmp_p and cmp_n. The comparator compares the input cmp_p and the input cmp_n. Then, the comparator outputs a logic high level (e.g., 1) if input cmp_p is greater than input cmp_n. Conversely, if input cmp_p is less than cmp_n, the comparator outputs a logic low level (e.g., 0). The comparator decision controls the capacitor arrays for DACs 208 and 304, and the comparator makes further comparisons that range from a most significant bit (MSB) to a least significant bit (LSB). When the conversion is complete, SAR 206 outputs an n-bit digital word.

The ELD coefficients, $a_x$, are adjusted by different methods, such as by varying the reference voltage Vref_ELD, reconfiguring the ELD compensation DAC capacitor sizes, adjusting the ELD compensation DAC resolution (e.g., varying the number of capacitors), and/or adjusting the threshold of quantizer 102. Varying the reference voltage Vref_ELD provides different reference voltages for coupling to ELD capacitors $C_{ELD}$. The capacitor sizes for ELD capacitors may vary. Also, the capacitance ratios are denoted by the ratios 8, 4, 2, and 1; however, other capacitance ratios may be used. Also, capacitance ratios may not be the same in different ELD compensation DACs 304. The number of bits processed by ELD compensation DAC capacitors may be varied by varying the number of capacitors in ELD capacitor array 304. Further, the threshold of comparator 306 may be adjusted. Any combination of the above may be reconfigured for the ELD compensation DAC capacitors to adjust the ELD coefficients, $a_x$.

Figure 4:
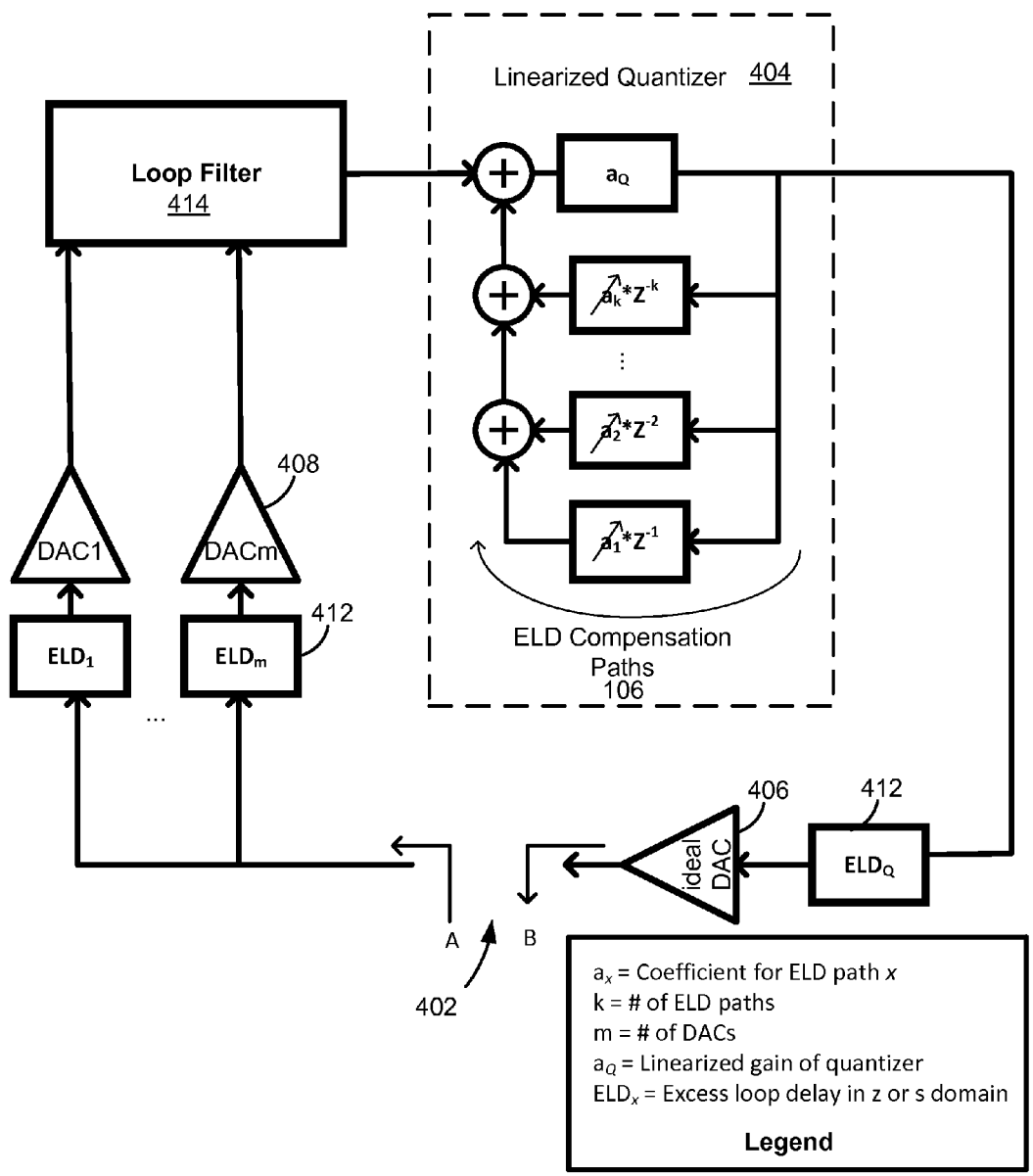
FIG. 4 depicts an example of programming the coefficients according to one embodiment.

As mentioned above, the ELD compensation coefficients may be programmable. FIG. 4 depicts an example of programming the coefficients according to one embodiment. Each ELD compensation path 106 may have variable and programmable coefficients. Also, each ELD compensation path 106 may be individually programmed.

The programming of ELD compensation paths 106 may be performed dynamically or pre-set. Any reprogramming may be performed based on various changes in the configuration of ADC 100, such as a result of a change in the sampling rate, internal loop filter amplifier tuning, quantizer reconfiguration, or any other system-level change that will impact the ELD in any of the feedback paths.

To compute the coefficients in ELD compensation paths 106, the ADC feedback loop 104 is opened and linearized. For example, as shown at 402, ADC feedback loop 104 has been opened. Also, the circuit has been linearized by including a linearized quantizer 404 with a linearized gain of $a_Q$, an ideal DAC 406, a set of ideal DACs 408, and an ideal loop filter 414. $ELD_x$ is the excess loop delay in the Z or S domain shown at 412. The ELDs may be found in feedback path 104 or in the quantizer. For example, DACs 408 are modeling the set of DACs 112. DAC 406 is used to inspect the impulse response output in an analog format instead of a digital format.

The number of ELD paths is "k" in ELD compensation paths 106 and the coefficient $a_x$ is the coefficient for an ELD path x. The number of coefficients $a_x$ may be determined by the length of the longest amount of excess loop delay. For example, a rule may be that the order should be greater than the ceiling of (ELD/Ts) where Ts is the sampling period for the quantizer.

Figure 5:
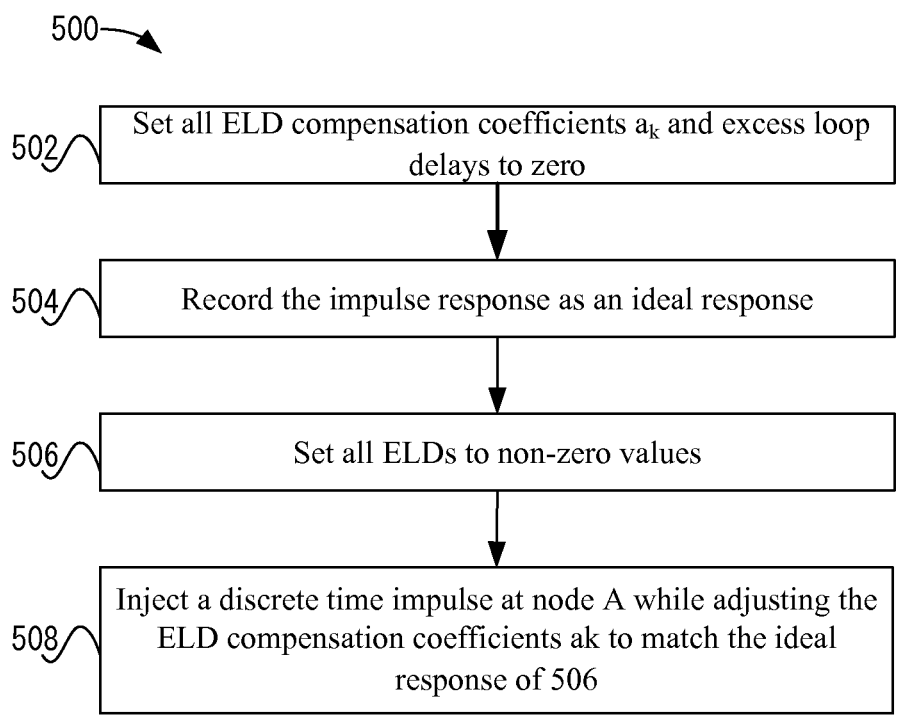
FIG. 5 depicts a simplified flowchart of a method for determining the ELD compensation coefficients according to one embodiment.

FIG. 5 depicts a simplified flowchart 500 of a method for determining the ELD compensation coefficients according to one embodiment. Different coefficient sets may be determined for different ADC configurations. In one embodiment, the different coefficient sets are determined a priori, and can then be configured in an ADC. For example, for an ADC configuration, the applicable coefficients can be programmed for multiple ELD compensation paths 106. Also, if an ADC configuration changes during operation, the applicable coefficients for the change may be dynamically programmed.

In the programming process, at 502, all ELD compensation coefficients a, and excess loop delays are set to zero. Referring to FIG. 4, at a node "A", a discrete time impulse is injected. At 504, at a node "B", the impulse response is recorded as an ideal response, $B_{ideal}$.

After determining an ideal response, then, excess loop delays may be included in ADC 100 for testing. Thus, at 506, ELDs 412 may be set to non-zero values. At 510, a discrete time impulse at node A is injected while adjusting the ELD compensation coefficients $a_x$. For example, the ELD compensation coefficients $a_x$ may be adjusted via an impulse invariant solving algorithm to get the best fit between the ideal impulse response $B_{ideal}$ and the impulse response $B_{ideal\_}$approx, which is the impulse response after adjusting the ELD compensation coefficients $a_x$. Although an impulse invariant solving algorithm is used, other algorithms may be used, such as a mean squared error algorithm. The goal of the adjustment of the coefficients is to make the impulse response $B_{ideal\_approx}$ to be the closest fit to the impulse response $B_{ideal}$.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a quantizer configured to convert an analog input signal to a digital signal, the quantizer comprising:
   a first feedback path including a first digital to analog converter (DAC) coupled from an output of the quantizer to a summing junction that is coupled to an input of the quantizer, wherein the first feedback path converts the digital signal to a first corresponding analog value for combining with the analog input signal at the summing junction; and
   a plurality of excess loop delay (ELD) compensation paths coupled to the summing junction, wherein the plurality of excess loop delay (ELD) compensation paths compensate for excess loop delay from a second feedback path coupled from the output of the quantizer to input of the quantizer, and wherein a set of second DACs in the second feedback path convert the digital signal to a second corresponding analog value for combining with the analog input signal.

2. The circuit of claim 1, wherein the plurality of ELD compensation paths are programmable to compensate for different excess loop delays.

3. The circuit of claim 2, wherein the plurality of ELD compensation paths are associated with coefficients that are programmable to different values.

4. The circuit of claim 1, wherein an ELD compensation path in the plurality of ELD compensation paths has a different resolution then the digital signal.

5. The circuit of claim 1, wherein the plurality of ELD compensation paths are coupled to a capacitor array of the first DAC.

6. The circuit of claim 4, wherein the plurality of ELD compensation paths comprise a plurality of capacitor arrays coupled to the capacitor array of the first DAC.

7. The circuit of claim 1, wherein:
   the quantizer includes a comparator configured to compare the analog input signal to a reference and output a digital value for the digital signal, and
   the summing junction is coupled to the comparator.

8. The circuit of claim 7, wherein the quantizer includes a successive approximation register (SAR) configured to store the digital value from the comparator.

9. The circuit of claim 7, wherein the analog input signal is stored in a sample and hold circuit, and then input into the summing junction.

10. The circuit of claim 1, wherein the summing junction combines the analog input signal combined with the second corresponding analog value from the second feedback path, the first corresponding analog value from the first feedback path, and a plurality of values from the plurality of compensation paths.

11. The circuit of claim 1, wherein each ELD compensation path in the plurality of ELD compensation paths comprises a set of delay elements to provide a different delay.

12. A system comprising:
    a loop filter configured to receive an analog input signal;
    a quantizer configured to convert the analog input signal to a digital signal, the quantizer comprising a first feedback path including a first digital to analog converter (DAC) coupled from an output of the quantizer to a summing junction that is coupled to an input of the quantizer, wherein the first feedback path converts the digital signal to a first corresponding analog value for combining with the analog input signal at the summing junction; and
    a second feedback path coupled from the output of the quantizer to input of the loop filter, wherein a set of second DACs in the second feedback path converts the digital signal to a second corresponding analog value for combining with the analog input signal in the loop filter,
    wherein the quantizer comprises a plurality of excess loop delay (ELD) compensation paths coupled to the summing junction, and wherein the plurality of excess loop delay (ELD) compensation paths compensate for excess loop delay from the second feedback path.

13. The system of claim 12, wherein the plurality of ELD compensation paths are programmable to compensate for different excess loop delays.

14. The system of claim 13, wherein the plurality of ELD compensation paths are associated with coefficients that are programmable to different values.

15. The system of claim 12, wherein an ELD compensation path in the plurality of ELD compensation paths has a different resolution then the digital signal.

16. The system of claim 12, wherein the plurality of ELD compensation paths are coupled to a capacitor array of the first DAC.

17. The system of claim 15, wherein the plurality of ELD compensation paths comprise a plurality of capacitor arrays coupled to the capacitor array of the first DAC.

18. The system of claim 12, wherein:
    the quantizer includes a comparator configured to compare the analog input signal to a reference and output a digital value for the digital signal, and
    the summing junction is coupled to the comparator.

19. The system of claim 12, wherein the summing junction combines the analog input signal combined with the second corresponding analog value from the second feedback path, the first corresponding analog value from the first feedback path, and a plurality of values from the plurality of compensation paths.

20. The system of claim 12, wherein each ELD compensation path in the plurality of ELD compensation paths comprises a set of delay elements to provide a different delay.

21. A method comprising:
    converting, at a quantizer, an analog input signal to a digital signal, wherein converting comprises:
    converting, via a first feedback path, the digital signal to a first corresponding analog value for combining with the analog input signal at a summing junction, wherein the first feedback path includes a first digital to analog converter (DAC) coupled from an output of the quantizer to the summing junction that is coupled to an input of the quantizer; and
    converting, by a set of second DACs in a plurality of excess loop delay (ELD) compensation paths of a second feedback path, the digital signal to a second corresponding analog value for combining with the analog input signal, wherein the plurality of excess loop delay (ELD) compensation paths are coupled to the summing junction, and wherein the plurality of excess loop delay (ELD)

compensation paths compensate for excess loop delay from the second feedback path that is coupled from the output of the quantizer to input of the quantizer.

22. The method of claim 21, further comprising programming the plurality of ELD compensation paths to compensate for different excess loop delays.

23. The method of claim 22, further comprising associating the plurality of ELD compensation paths with coefficients that are programmable to different values.

24. The method of claim 21, wherein an ELD compensation path in the plurality of ELD compensation paths has a different resolution then the digital signal.

25. The method of claim 21, further comprising combining, by the summing junction, the analog input signal with the second corresponding analog value from the second feedback path, the first corresponding analog value from the first feedback path, and a plurality of values from the plurality of compensation paths.

* * * * *

UNITED STATES PATENT AND TRADEMARK OFFICE
CERTIFICATE OF CORRECTION

| | | |
|---|---|---|
| PATENT NO. | : 9,325,341 B2 | Page 1 of 1 |
| APPLICATION NO. | : 14/475852 | |
| DATED | : April 26, 2016 | |
| INVENTOR(S) | : Elias Hani Dagher et al. | |

It is certified that error appears in the above-identified patent and that said Letters Patent is hereby corrected as shown below:

In the Claims

Column 7, line 45, replace "The circuit of claim 4" with "The circuit of claim 5".

Column 8, line 34, replace "The system of claim 15" with "The system of claim 16".

Signed and Sealed this
Ninth Day of August, 2016

Michelle K. Lee
*Director of the United States Patent and Trademark Office*